(12) United States Patent
Xu

(10) Patent No.: US 9,696,988 B2
(45) Date of Patent: Jul. 4, 2017

(54) UPGRADE PROCESSING METHOD, APPARATUS AND SYSTEM FOR CPLD

(71) Applicant: Huawei Technologies Co., Ltd., Shenzhen (CN)

(72) Inventor: Pengsheng Xu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 10 days.

(21) Appl. No.: 14/717,781

(22) Filed: May 20, 2015

(65) Prior Publication Data

US 2015/0339118 A1    Nov. 26, 2015

(30) Foreign Application Priority Data

May 20, 2014    (CN) .......................... 2014 1 0214755

(51) Int. Cl.
*G06F 9/445* (2006.01)
*G06F 17/50* (2006.01)

(52) U.S. Cl.
CPC ............... *G06F 8/665* (2013.01); *G06F 8/67* (2013.01); *G06F 17/5054* (2013.01)

(58) Field of Classification Search
CPC ........... G06F 8/665; G06F 8/67; G06F 8/5054
See application file for complete search history.

(56) References Cited

U.S. PATENT DOCUMENTS

| 5,790,882 A | * | 8/1998 | Silver ................. G06F 17/5072 703/27 |
| 7,772,881 B1 | * | 8/2010 | Yap .......................... G06F 8/67 326/41 |
| 2013/0031538 A1 | | 1/2013 | Skalsky |

OTHER PUBLICATIONS

"Programming Tools User Guide," Lattice Semiconductor, Retrieved from the Internet: URL:http://www.latticesemi.com/~/media/LatticeSemi/Documents/UserManuals/MQ/ProgramingToolsUserGuide31.pdf?document_id=50445 [retrieved on Sep. 21, 2015], Dec. 2013, 154 pages.

(Continued)

*Primary Examiner* — Emerson Puente
*Assistant Examiner* — Erika Kretzmer
(74) *Attorney, Agent, or Firm* — Conley Rose, P.C.

(57) ABSTRACT

An upgrade is performed for a complex programmable logical device (CPLD), the method comprising: splitting a serial vector format (SVF) file into a first SVF sub-file and a second SVF sub-file; generating a first Versa Module Europa (VME) bus file according to the first SVF sub-file; generating a second VME bus file according to the second SVF sub-file; and backing up register information and a pin signal of the CPLD. The method further comprises upgrading a program of the CPLD using the first SVF sub-file and the first VME bus file. The method further comprises using the second SVF sub-file and the second VME bus file to release the pin of the CPLD after the register information and the pin signal of the CPLD are restored by the first SVF sub-file and the first VME bus file.

11 Claims, 4 Drawing Sheets

(56) References Cited

OTHER PUBLICATIONS

Foreign Communication From A Counterpart Application, European Application No. 15167943.8, Extended European Search Report dated Oct. 6, 2015, 5 pages.
"IEEE Standard for In-System Configuration of Programmable Devices," IEEE Computer Society, IEEE Std. 1532-2002, Jan. 10, 2003, 149 pages.
"IEEE Standard Test Access Port and Boundary-Scan Architecture," Test Technology Standards Committee of the IEEE Computer Society, IEEE Std. 1149.1-2001, Jun. 14, 2001, 208 pages.
Foreign Communication From A Counterpart Application, European Application No. 15167943.8, European Office Action dated Feb. 13, 2017, 4 pages.

* cited by examiner

UPGRADE PROCESSING METHOD, APPARATUS AND SYSTEM FOR CPLD

CROSS-REFERENCE TO RELATED APPLICATION

This application claims priority to Chinese Patent Application No. 201410214755.1, filed on May 20, 2014, which is hereby incorporated by reference in its entirety.

TECHNICAL FIELD

The present invention relates to the field of communications technologies, and in particular, to an upgrade processing method, apparatus and system for a complex programmable logical device (CPLD).

BACKGROUND

A CPLD is a digital integrated circuit for constructing a logical function according to a user requirement, and is widely applied in various devices, such as a board. With an increasingly higher requirement for reliability and security of a device, if a problem occurs when the CPLD runs, or a user requirement changes, a program of the CPLD needs to be upgraded. However, a pin of the CPLD is usually released after the program of the CPLD is upgraded, which may enable a pin signal of the CPLD to jump after the upgrade and therefore result in different statuses of a device on which the CPLD is located before and after the upgrade; consistency of the statuses before and after the upgrade needs to be ensured by means of resetting, thereby resulting in an interruption of a current service of the device. If the signal that jumps is a key signal, for example, a control signal that is of the device and is used to control functions of some service processing modules on the device, services of the entire device may be affected.

SUMMARY

Embodiments of the present invention provide an upgrade processing method, apparatus and system for a CPLD, which can ensure consistency of device statuses before and after the CPLD is upgraded without a need to interrupt a service of a current system. Therefore, an impact on the service is prevented, and reliability of the system is improved.

An embodiment of the present invention provides an upgrade processing method for a CPLD, including: backing up register information and a pin signal of the CPLD; upgrading a program of the CPLD, including loading an upgrade program of the CPLD into a flash memory of the CPLD in a background mode; locking a pin of the CPLD; and loading the upgrade program in the flash memory of the CPLD into a static random access memory (SRAM) of the CPLD; after the program of the CPLD is upgraded, restoring register information and a pin signal of the CPLD according to the backed-up register information and pin signal; and after the register information and the pin signal of the CPLD are restored, releasing the pin of the CPLD.

Further, before the upgrading a program of the CPLD, the method further includes: generating a serial vector format (SVF) file, and generating a Versa Module Europa (VME) bus file according to the SVF file, where the SVF file is used to instruct an upgrade processing process of the CPLD, and the VME bus file is used to execute upgrade processing of the CPLD.

The generating a VME bus file according to the SVF file includes: splitting the SVF file into a first SVF sub-file and a second SVF sub-file, where the first SVF sub-file is used to instruct operations of executing the upgrade processing of the CPLD until upgrading the program of the CPLD is complete; and the second SVF sub-file is used to instruct to release the pin of the CPLD after the register information and the pin signal of the CPLD are restored; generating a first VME bus sub-file according to the first SVF sub-file, where the first VME bus sub-file is used to execute an operation of upgrading the program of the CPLD; and generating a second VME bus sub-file according to the second SVF sub-file, where the second VME bus sub-file is used to execute an operation of releasing the pin of the CPLD.

An embodiment of the present invention provides an upgrade processing apparatus for a CPLD, including: a backup module configured to back up register information and a pin signal of the CPLD; an upgrading module configured to upgrade a program of the CPLD after the backup module backs up the register information and the pin signal of the CPLD, and specifically configured to load an upgrade program of the CPLD into a flash memory of the CPLD in a background mode; lock a pin of the CPLD; and load the upgrade program in the flash memory of the CPLD into a SRAM of the CPLD; a restoring module configured to restore register information and a pin signal of the CPLD according to the backed-up register information and pin signal after the upgrading module upgrades the program of the CPLD; and a releasing module configured to release the pin of the CPLD after the restoring module restores the register information and the pin signal of the CPLD.

Further, the apparatus further includes: a generating module configured to generate a SVF file before the program of the CPLD is upgraded, and generate a VME bus file according to the SVF file, where the SVF file is used to instruct an upgrade processing process of the CPLD, and the VME bus file is used to execute upgrade processing of the CPLD.

The generating module is specifically configured to: split the SVF file into a first SVF sub-file and a second SVF sub-file, where the first SVF sub-file is used to instruct operations of executing the upgrade processing of the CPLD until upgrading the program of the CPLD is complete; and the second SVF sub-file is used to instruct to release the pin of the CPLD after the register information and the pin signal of the CPLD are restored; generate a first VME bus sub-file according to the first SVF sub-file, where the first VME bus sub-file is used to execute an operation of upgrading the program of the CPLD; and generate a second VME bus sub-file according to the second SVF sub-file, where the second VME bus sub-file is used to execute an operation of releasing the pin of the CPLD.

An embodiment of the present invention provides an upgrade processing apparatus for a CPLD, including one or more processors, a memory, and one or more programs, where the one or more programs are stored in the memory and configured to be executed by the one or more processors, and the one or more programs include: an instruction to back up register information and a pin signal of the CPLD; instructions to upgrade a program of the CPLD, including an instruction to load an upgrade program of the CPLD into a flash memory of the CPLD in a background mode; an instruction to lock a pin of the CPLD; and an instruction to load the upgrade program in the flash memory of the CPLD into a SRAM of the CPLD; an instruction to restore register information and a pin signal of the CPLD according to the backed-up register information and pin signal after the program of the CPLD is upgraded; and an instruction to release the pin of the CPLD after the register information and the pin signal of the CPLD are restored.

Further, before the instructions to upgrade the program of the CPLD are executed, the following instructions may further be executed: instructions to generate a SVF file and generate a VME bus file according to the SVF file, where the SVF file is used to instruct an upgrade processing process of the CPLD, and the VME bus file is used to execute upgrade processing of the CPLD.

The instruction to generate the VME bus file according to the SVF file includes: an instruction to split the SVF file into a first SVF sub-file and a second SVF sub-file, where the first SVF sub-file is used to instruct operations of executing the upgrade processing of the CPLD until upgrading the program of the CPLD is complete; and the second SVF sub-file is used to instruct to release the pin of the CPLD after the register information and the pin signal of the CPLD are restored; an instruction to generate a first VME bus sub-file according to the first SVF sub-file, where the first VME bus sub-file is used to execute an operation of upgrading the program of the CPLD; and an instruction to generate a second VME bus sub-file according to the second SVF sub-file, where the second VME bus sub-file is used to execute an operation of releasing the pin of the CPLD.

An embodiment of the present invention provides an upgrade processing system for a CPLD, including the CPLD and an upgrade processing apparatus for the CPLD, where the upgrade processing apparatus for the CPLD uses the foregoing upgrade processing apparatus for a CPLD.

In the embodiments of the present invention, before executing a task of upgrading a CPLD, an upgrade processing apparatus backs up register information and a pin signal of the CPLD in a current status; then the upgrade processing apparatus executes the upgrade of the CPLD, loads an upgrade program of the CPLD into a Flash of the CPLD in a background mode, locks a current pin of the CPLD, and then loads the upgrade program in the Flash of the CPLD into an SRAM of the CPLD for running; the upgrade processing apparatus does not immediately release the current pin of the CPLD, but restores the foregoing backed-up internal information of the CPLD into the current CPLD before releasing the current pin of the CPLD, so as to keep consistency between the register information and the pin signal of the CPLD before the upgrade and register information of the current CPLD and a pin signal of the CPLD after the upgrade; the upgrade processing apparatus finally releases a current output pin of the CPLD, which may implement an operation of upgrading the CPLD when a device is in an online state. Consistency of device statuses before and after the CPLD is upgraded can be ensured without a need to interrupt a service of a current system. Therefore, an impact on the service is prevented, and reliability of the system is improved.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

Figure 1:
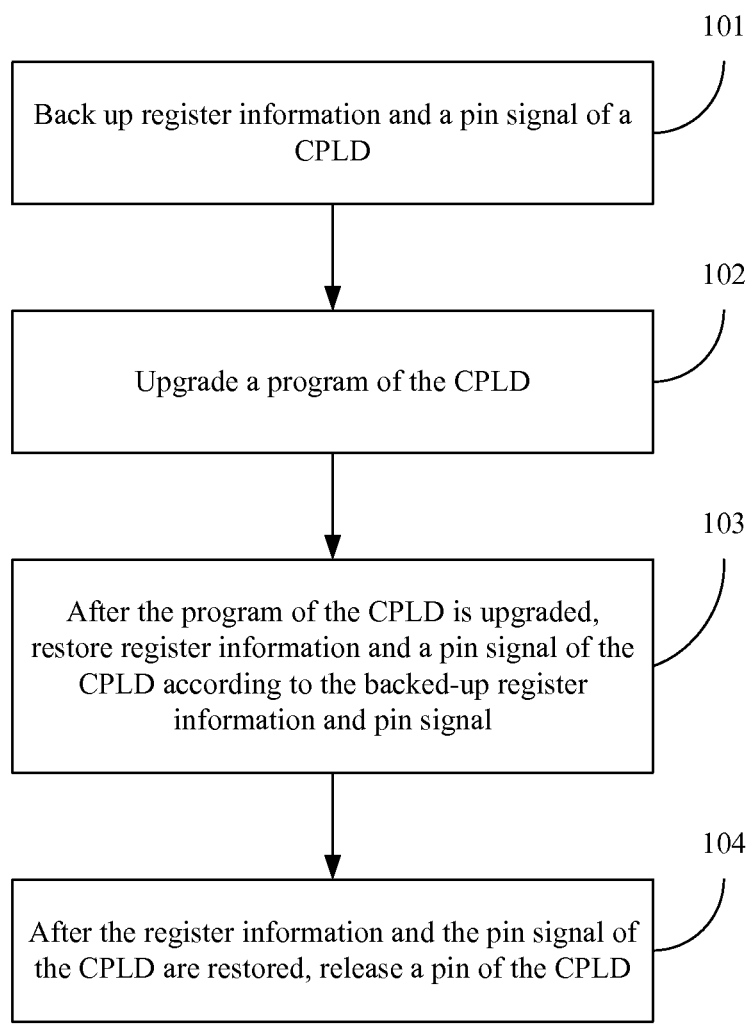
FIG. 1 is a flowchart of an upgrade processing method for a CPLD according to an embodiment of the present invention.

FIG. 1 is a flowchart of an upgrade processing method for a CPLD according to an embodiment of the present invention. The upgrade processing method can implement a CPLD upgrade operation for a device in an online state in a scenario in which normal working of the CPLD is not interrupted and a program of the CPLD needs to be upgraded in a running process of the device on which the CPLD is located, for example, a board. As shown in FIG. 1, the upgrade processing method for the CPLD may include:

Step 101: Back up register information and a pin signal of the CPLD.

Before upgrading the CPLD, an upgrade processing apparatus backs up the register information and the pin signal of the CPLD into a storage unit of the upgrade processing apparatus.

In this embodiment of the present invention, the upgrade processing apparatus may be a dedicated device, or may be located on a same device as the CPLD, which is not limited in the present invention, as long as the present invention can be implemented.

Figure 2:
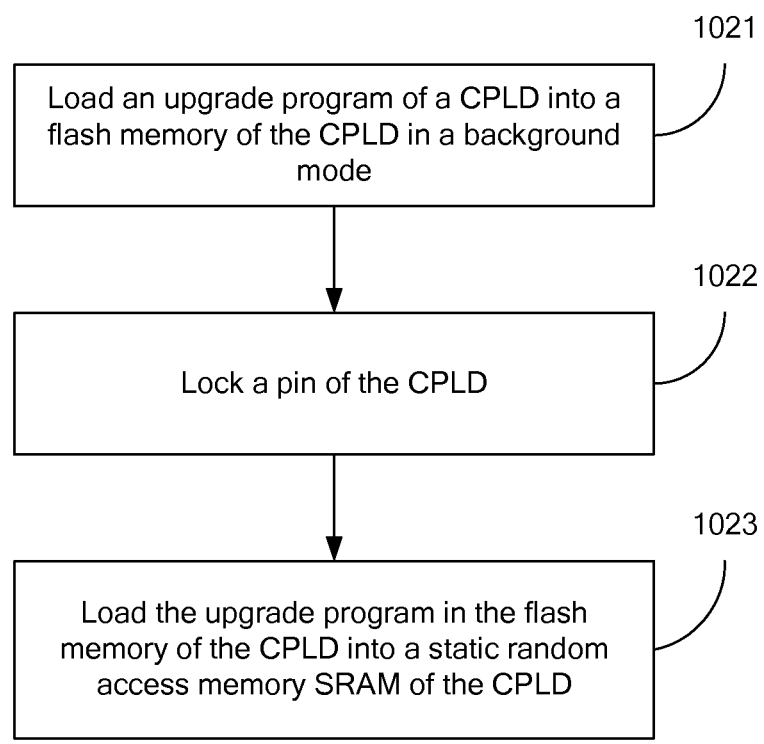
FIG. 2 is a specific flowchart for upgrading a program of a CPLD in an upgrade processing method for the CPLD according to an embodiment of the present invention.

Step 102: Upgrade a program of the CPLD. Specifically, as shown in FIG. 2, FIG. 2 is a specific flowchart for upgrading the program of the CPLD according to an embodiment of the present invention. The upgrading the program of the CPLD includes:

1021: Load an upgrade program of the CPLD into a flash memory of the CPLD in a background mode.

Specifically, the upgrade processing apparatus may load the upgrade program of the CPLD into the flash memory (Flash) of the CPLD in the background mode. That the upgrade program of the CPLD is loaded into the Flash of the CPLD in the background mode can ensure normal working of the CPLD.

1022: Lock a pin of the CPLD.

The upgrade processing apparatus executes an operation of locking the pin of the CPLD, that is, locking a pin status of the current CPLD.

1023: Load the upgrade program in the flash memory of the CPLD into a SRAM of the CPLD.

The upgrade processing apparatus loads the upgrade program of the CPLD from the Flash in the CPLD into the SRAM in the CPLD for running.

Step 103: After the program of the CPLD is upgraded, restore register information and a pin signal of the CPLD according to the backed-up register information and pin signal.

After the program of the CPLD is upgraded, the register information and the pin signal that are of the CPLD and backed up in step 101, namely, the register information and the pin signal of the CPLD before the upgrade, are restored into the current CPLD, which ensures that the register information and the pin signal of the CPLD before the upgrade are consistent with the register information and the pin signal of the current CPLD after the upgrade, so as to ensure consistency of statuses of a board before and after the CPLD is upgraded.

Step 104: After the register information and the pin signal of the CPLD are restored, release the pin of the CPLD.

After the register information and the pin signal of the CPLD are restored, the upgrade processing apparatus executes an operation of releasing the pin of the CPLD, so as to ensure that a signal output from the pin of the CPLD is consistent with a signal output from the pin of the CPLD before the program of the CPLD is upgraded. For example, before the program of the CPLD is upgraded, the pin signal of the CPLD is at a high level, and the pin signal is backed up. After the program of the CPLD is upgraded, because the pin signal of the CPLD is restored according to the backed-up pin signal, a control signal on the pin of the upgraded CPLD does not jump and is still at the high level.

Before step 101, the method may further include: generating a SVF file, and generating a VME bus file according to the SVF file, which specifically includes: splitting the SVF file into a first SVF sub-file and a second SVF sub-file, where the first SVF sub-file is used to instruct operations of executing upgrade processing of the CPLD until upgrading the program of the CPLD is complete; and the second SVF sub-file is used to instruct to release the pin of the CPLD after the register information and the pin signal of the CPLD are restored; generating a first VME bus sub-file according to the first SVF sub-file, where the first VME bus sub-file is used to execute an operation of upgrading the program of the CPLD; and generating a second VME bus sub-file according to the second SVF sub-file, where the second VME bus sub-file is used to execute an operation of releasing the pin of the CPLD.

Correspondingly, in step 102, upgrading the program of the CPLD includes: loading the upgrade program of the CPLD into the flash memory (Flash) of the CPLD in the background mode according to the first VME bus sub-file; locking the pin of the CPLD; and loading the upgrade program in the Flash of the CPLD into the SRAM of the CPLD.

Correspondingly, in step 104, releasing the pin of the CPLD includes releasing the pin of the CPLD according to the second VME bus sub-file.

Specifically, before backing up the register information and the pin signal of the CPLD, that is, before step 101, the upgrade processing apparatus generates an SVF file in a background loading mode, and then splits the generated SVF file into a first SVF sub-file and a second SVF sub-file. Then, the upgrade processing apparatus generates, according to the first SVF sub-file and the second SVF sub-file, a first VME bus sub-file corresponding to the first SVF sub-file and a second VME bus sub-file corresponding to the second SVF sub-file respectively.

The first SVF sub-file is used to instruct the upgrade processing apparatus to load the upgrade program of the CPLD into the Flash of the CPLD in the background mode, lock the pin status of the current CPLD, load the upgrade program stored in the Flash into the SRAM of the CPLD for running, and pause. That is, instruct step 1023, and pause. The first VME bus sub-file corresponding to the first SVF sub-file is used to execute operations that the upgrade processing apparatus loads the upgrade program of the CPLD into the Flash of the CPLD in the background mode, locks the pin status of the current CPLD, loads the upgrade program stored in the Flash into the SRAM of the CPLD for running, and pauses. That is, execute step 1023, and pause.

The second SVF sub-file is used to instruct the upgrade processing apparatus to release the pin status of the current CPLD, that is, instruct step 104. The second VME bus sub-file corresponding to the second SVF sub-file is used to execute an operation that the upgrade processing apparatus releases the pin status of the CPLD, that is, execute step 104.

In this embodiment, before a CPLD is upgraded, register information and a pin signal of the CPLD are backed up, and then a program of the CPLD is upgraded. After the program of the CPLD is upgraded, a pin of the CPLD is not immediately released, but the backed-up register information and pin signal of the CPLD are first restored into the CPLD to keep consistency between the register information and the pin signal of the CPLD before upgrade and register information of the current CPLD and a pin signal of the CPLD after the upgrade, and finally the pin of the CPLD is released, so as to complete upgrade processing of the CPLD. Consistency of device statuses before and after the CPLD is upgraded can be ensured without a need to interrupt a service of a current system. Therefore, an impact on the service is prevented, and reliability of the system is improved.

Figure 3:
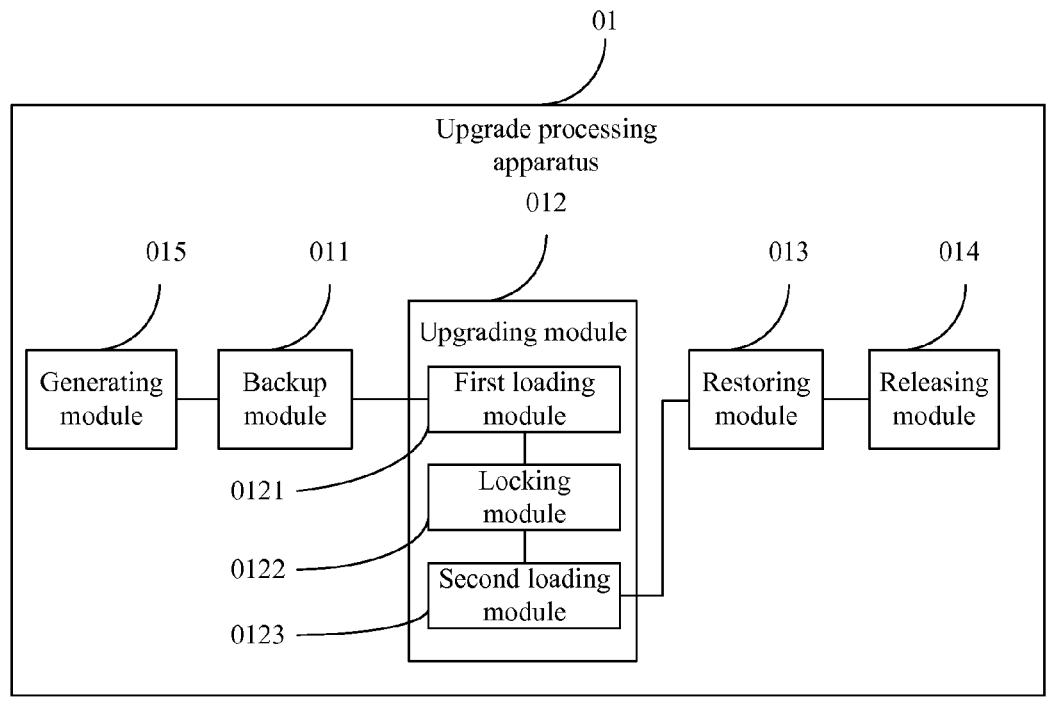
FIG. 3 is a schematic structural diagram of an upgrade processing apparatus for a CPLD according to an embodiment of the present invention.

FIG. 3 is a schematic structural diagram of an upgrade processing apparatus for a CPLD according to an embodiment of the present invention. The upgrade processing apparatus can implement a CPLD upgrade operation for a device in an online state in a scenario in which normal working of the CPLD is not interrupted and a program of the CPLD needs to be upgraded in a running process of the device on which the CPLD is located, for example, a board. As shown in FIG. 3, an upgrade processing apparatus 01 in this embodiment may include a backup module 011, an upgrading module 012, a restoring module 013, a releasing module 014, and a generating module 015.

Specifically, the backup module 011 is configured to back up register information and a pin signal of the CPLD.

The upgrading module 012 is configured to upgrade a program of the CPLD after the backup module 011 backs up the register information and the pin signal of the CPLD, and specifically configured to load an upgrade program of the CPLD into a flash memory of the CPLD in a background mode; lock a pin of the CPLD; and load the upgrade program in the flash memory of the CPLD into a SRAM of the CPLD.

Further, the upgrading module 012 may include a first loading module 0121, a locking module 0122, and a second loading module 0123. The first loading module 0121 is configured to load the upgrade program of the CPLD into the flash memory of the CPLD in the background mode. The locking module 0122 is configured to lock the pin of the CPLD. The second loading module 0123 is configured to load the upgrade program in the flash memory of the CPLD into the (SRAM of the CPLD.

The restoring module 013 is configured to restore register information and a pin signal of the CPLD according to the backed-up register information and pin signal after the upgrading module upgrades the program of the CPLD.

The releasing module 014 is configured to release the pin of the CPLD after the restoring module restores the register information and the pin signal of the CPLD.

Further, the apparatus may further include the generating module 015.

Specifically, the generating module 015 is configured to generate a serial vector format SVF file after the upgrading module upgrades the program of the CPLD, and generate a VME bus file according to the SVF file, where the SVF file is used to instruct an upgrade processing process of the CPLD, and the VME bus file is used to execute upgrade processing of the CPLD. The generating module is specifically configured to: split the SVF file into a first SVF sub-file and a second SVF sub-file, where the first SVF sub-file is used to instruct operations of executing the upgrade processing of the CPLD until upgrading the program of the CPLD is complete; and the second SVF sub-file is used to instruct to release the pin of the CPLD after the register information and the pin signal of the CPLD are restored; generate a first VME bus sub-file according to the first SVF sub-file, where the first VME bus sub-file is used to execute an operation of upgrading the program of the CPLD; and generate a second VME bus sub-file according to the second SVF sub-file, where the second VME bus sub-file is used to execute an operation of releasing the pin of the CPLD.

The upgrade processing apparatus for a CPLD according to this embodiment may be configured to execute the technical solution of the method embodiment shown above, implementation principles and technical effects thereof are similar, and details are not repeatedly described herein.

Figure 4:
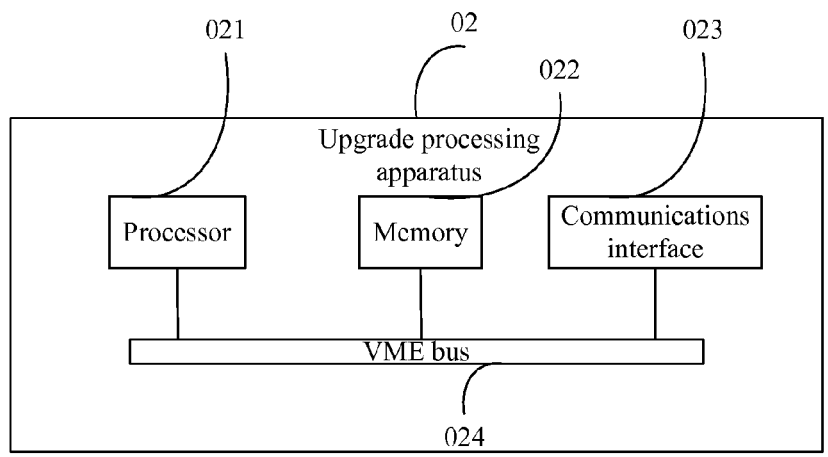
FIG. 4 is a schematic structural diagram of another upgrade processing apparatus for a CPLD according to an embodiment of the present invention.

FIG. 4 is a schematic structural diagram of another upgrade processing apparatus for a CPLD according to an embodiment of the present invention. As shown in FIG. 4, an upgrade processing apparatus 02 in this embodiment includes a processor 021, a memory 022, a communications interface 023, and a VME bus 024, where the processor 021, the memory 022, and the communications interface 023 are connected to each other by using the VME bus 024.

The memory is configured to store a program. Specifically, the program may include program code, where the program code includes a computer operation instruction. The memory may include a random access memory (RAM), and may also include a non-volatile memory, for example, at least one magnetic disk memory.

The processor 021 executes the program stored by the memory 022, and is configured to: back up register information and a pin signal of the CPLD; upgrade a program of the CPLD, including loading an upgrade program of the CPLD into a flash memory of the CPLD in a background mode; locking a pin of the CPLD; and loading the upgrade program in the flash memory of the CPLD into a SRAM of the CPLD; after the program of the CPLD is upgraded, restore register information and a pin signal of the CPLD according to the backed-up register information and pin signal; and after the register information and the pin signal of the CPLD are restored, release the pin of the CPLD.

Before the upgrading a program of the CPLD, the processor 021 is configured to generate a SVF file, and generate a VME bus file according to the SVF file, where the SVF file is used to instruct an upgrade processing process of the CPLD, and the VME bus file is used to execute upgrade processing of the CPLD.

The generating a VME bus file according to the SVF file includes: splitting the SVF file into a first SVF sub-file and a second SVF sub-file, where the first SVF sub-file is used to instruct operations of executing the upgrade processing of the CPLD until upgrading the program of the CPLD is complete; and the second SVF sub-file is used to instruct to release the pin of the CPLD after the register information and the pin signal of the CPLD are restored; generating a first VME bus sub-file according to the first SVF sub-file, where the first VME bus sub-file is used to execute an operation of upgrading the program of the CPLD; and generating a second VME bus sub-file according to the second SVF sub-file, where the second VME bus sub-file is used to execute an operation of releasing the pin of the CPLD.

The upgrade processing apparatus for a CPLD in this embodiment may be a dedicated device, or may be located in a same device as the CPLD. The upgrade processing apparatus may be configured to execute the technical solution of the method embodiment shown above, implementation principles and technical effects thereof are similar, and details are not repeatedly described herein.

Figure 5:
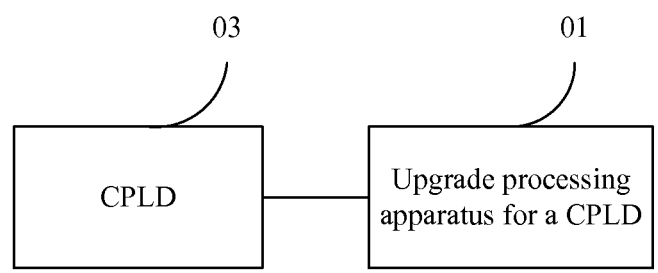
FIG. 5 is a schematic structural diagram of an upgrade processing system for a CPLD according to an embodiment of the present invention.

FIG. 5 is a schematic structural diagram of an upgrade processing system for a CPLD according to an embodiment of the present invention. As shown in FIG. 5, the system in this embodiment includes a CPLD 03 and an upgrade processing apparatus 01 for a CPLD. The upgrade processing apparatus 01 for a CPLD may use a structure of the upgrade processing apparatus for a CPLD shown in FIG. 3 or FIG. 4. Correspondingly, the upgrade processing apparatus 01 may execute the technical solutions described in the embodiments in FIG. 1 and FIG. 2, implementation principles and technical effects thereof are similar, and details are not repeatedly described herein.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes: any medium that can store program code, such as a read-only memory (ROM), a RAM, a magnetic disc, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. An upgrade processing method for a complex programmable logical device (CPLD), the method comprising:
splitting a serial vector format (SVF) file into a first SVF sub-file and a second SVF sub-file, wherein the first SVF sub-file is used to instruct the CPLD to load an upgrade program of the CPLD into a flash memory of the CPLD in a background mode, lock a pin of the CPLD, load the upgrade program stored in the flash memory to a static random access memory (SRAM) of the CPLD, and pause, and wherein the second SVF-sub-file is used to instruct the CPLD to release the pin of the CPLD after the register information and the pin signal of the CPLD are restored;
generating a first Versa Module Europa (VME) bus file according to the first SVF sub-file, wherein the first VME bus file is used to execute an operation of upgrading the program of the CPLD;
generating a second VME bus file according to the second SVF sub-file, wherein the second VME bus file is used to execute an operation of releasing the pin of the CPLD;
backing up register information and a pin signal of the CPLD;
upgrading a program of the CPLD using the first SVF sub-file and the first VME bus file, wherein upgrading the program of the CPLD comprises:
loading the upgrade program of the CPLD into the flash memory of the CPLD in the background mode,
locking the pin of the CPLD, and
loading the upgrade program in the flash memory of the CPLD into the SRAM of the CPLD; and
restoring the register information and the pin signal of the CPLD using the second SVF sub-file and the second VME bus file, wherein the restoring comprises:
restoring the register information and the pin signal of the CPLD according to the backed-up register information and pin signal, and
releasing the pin of the CPLD.

2. The method according to claim 1, wherein the SVF file, the first VME bus file, and the second VME bus file are generated before upgrading the program of the CPLD.

3. The method according to claim 2, wherein the SVF file is used to instruct an upgrade processing process of the CPLD.

4. The method according to claim 1, wherein a first signal output from the pin of the CPLD before the program of the CPLD is updated is consistent with a second signal output from the pin of the CPLD after the program of the CPLD is updated.

5. An upgrade processing apparatus for a complex programmable logical device (CPLD), comprising: a processor configured to:
split a serial vector format (SVF) file into a first SVF sub-file and a second SVF sub-file, wherein the first SVF sub-file is used to instruct the CPLD to load an upgrade program of the CPLD into a flash memory of the CPLD in a background mode, lock a pin of the CPLD, load the upgrade program stored in the flash memory to a static random access memory (SRAM) of the CPLD, and pause, and wherein the second SVF-sub-file is used to instruct the CPLD to release the pin of the CPLD after the register information and the pin signal of the CPLD are restored;
generate a first Versa Module Europa (VME) bus file according to the first SVF sub-file, wherein the first VME bus file is used to execute an operation of upgrading the program of the CPLD;
generate a second VME bus file according to the second SVF sub-file, wherein the second VME bus file is used to execute an operation of releasing the pin of the CPLD;
back up register information and a pin signal of the CPLD;
upgrade a program of the CPLD after backing up the register information and the pin signal of the CPLD using the first SVF sub-file and the first VME bus file by:
loading the upgrade program of the CPLD into the flash memory of the CPLD in the background mode,
locking the pin of the CPLD, and
loading the upgrade program in the flash memory of the CPLD into the SRAM of the CPLD;
restoring the register information and the pin signal of the CPLD using the second SVF sub-file and the second VME bus file, wherein the restoring comprises:
restoring the register information and the pin signal of the CPLD according to the backed-up register information and pin signal, and
releasing the pin of the CPLD.

6. The apparatus according to claim 5, wherein the SVF file, the first VME bus file, and the second VME bus file are generated before the program of the CPLD is upgraded.

7. The method according to claim 6, wherein the SVF file is used to instruct an upgrade processing process of the CPLD.

8. The apparatus according to claim 5, wherein a first signal output from the pin of the CPLD before the program of the CPLD is updated is consistent with a second signal output from the pin of the CPLD after the program of the CPLD is updated.

9. An upgrade processing system for a complex programmable logical device (CPLD), the system comprising the CPLD and an upgrade processing apparatus for the CPLD, wherein the upgrade processing apparatus for the CPLD comprises: a processor configured to:
split a serial vector format (SVF) file into a first SVF sub-file and a second SVF sub-file, wherein the first SVF sub-file is used to instruct the CPLD to load an upgrade program of the CPLD into a flash memory of the CPLD in a background mode, lock a pin of the CPLD, load the upgrade program stored in the flash memory to a static random access memory (SRAM) of the CPLD, and pause, and wherein the second SVF-sub-file is used to instruct the CPLD to release the pin of the CPLD after the register information and the pin signal of the CPLD are restored;
generate a first Versa Module Europa (VME) bus file according to the first SVF sub-file, wherein the first VME bus file is used to execute an operation of upgrading the program of the CPLD;
generate a second VME bus file according to the second SVF sub-file, wherein the second VME bus file is used to execute an operation of releasing the pin of the CPLD;
back up register information and a pin signal of the CPLD;
upgrade a program of the CPLD after backing up the register information and the pin signal of the CPLD using the first SVF sub-file and the first VME bus file by:
loading the upgrade program of the CPLD into the flash memory of the CPLD in the background mode,
locking the pin of the CPLD, and
loading the upgrade program in the flash memory of the CPLD the SRAM of the CPLD;
restoring the register information and the pin signal of the CPLD using the second SVF sub-file and the second VME bus file, wherein the restoring comprises:

restoring the register information and the pin signal of the CPLD according to the backed-up register information and pin signal, and releasing the pin of the CPLD.

10. The upgrade processing system according to claim 9, wherein the SVF file, the first VME bus file, and the second VME bus file are generated before the program of the CPLD is upgraded.

11. The upgrade processing system according to claim 9, wherein the SVF file is used to instruct an upgrade processing process of the CPLD.

* * * * *